(12) United States Patent
Hickman et al.

(10) Patent No.: US 10,434,726 B1
(45) Date of Patent: Oct. 8, 2019

(54) FORMING THERMOPLASTIC COMPOSITE PARTS HAVING STEERED FIBER ORIENTATIONS

(71) Applicant: The Boeing Company, Chicago, IL (US)

(72) Inventors: Gregory James Schoepen Hickman, St. Louis, MO (US); James R. Fox, University City, MO (US); Charles R. Prebil, University City, MO (US); Randall Dow Wilkerson, O'Fallon, MO (US)

(73) Assignee: The Boeing Company, Chicago, IL (US)

( * ) Notice: Subject to any disclaimer, the term of this patent is extended or adjusted under 35 U.S.C. 154(b) by 376 days.

(21) Appl. No.: 14/797,946

(22) Filed: Jul. 13, 2015

(51) Int. Cl.
*B29C 70/34* (2006.01)
*G06F 17/50* (2006.01)
*B29C 51/08* (2006.01)
*B29C 70/38* (2006.01)
*B29L 31/30* (2006.01)
*B29C 70/46* (2006.01)

(52) U.S. Cl.
CPC ............ *B29C 70/34* (2013.01); *B29C 51/082* (2013.01); *B29C 70/382* (2013.01); *B29C 70/386* (2013.01); *G06F 17/50* (2013.01); *B29C 70/46* (2013.01); *B29L 2031/3076* (2013.01)

(58) Field of Classification Search
None
See application file for complete search history.

(56) References Cited

U.S. PATENT DOCUMENTS

| 6,537,413 | B1 * | 3/2003 | Hochet ............ | B29C 70/088 156/297 |
| 8,071,008 | B1 * | 12/2011 | Brachos ............ | B29C 70/46 264/234 |
| 8,349,105 | B2 | 1/2013 | Kehrl et al. | |
| 8,632,653 | B2 | 1/2014 | Brown et al. | |
| 2003/0175520 | A1 * | 9/2003 | Grutta ............ | B29C 70/46 428/411.1 |
| 2009/0301648 | A1 * | 12/2009 | Hogg ............ | B29C 70/386 156/230 |
| 2010/0310380 | A1 * | 12/2010 | Bech ............ | B29C 70/382 416/230 |
| 2013/0174969 | A1 * | 7/2013 | Karb ............ | B29B 11/16 156/196 |
| 2015/0099091 | A1 * | 4/2015 | Kurtz ............ | B29C 70/345 428/114 |
| 2015/0129119 | A1 * | 5/2015 | Askan ............ | B29C 70/32 156/212 |
| 2016/0001464 | A1 * | 1/2016 | Suzuki ............ | B32B 5/26 264/544 |

FOREIGN PATENT DOCUMENTS

EP 0649736 A1 * 4/1995 ............ B29C 43/18
JP WO201417148 A * 10/2014

\* cited by examiner

*Primary Examiner* — Barbara J Musser
(74) *Attorney, Agent, or Firm* — Yee & Associates, P.C.

(57) ABSTRACT

Thermoplastic composite parts are produced by automated fiber placement followed by stamp forming a layup having tailored fiber orientations. The tailored fiber orientations are achieved by tow steering and result in a layup that does not wrinkle during forming.

18 Claims, 9 Drawing Sheets

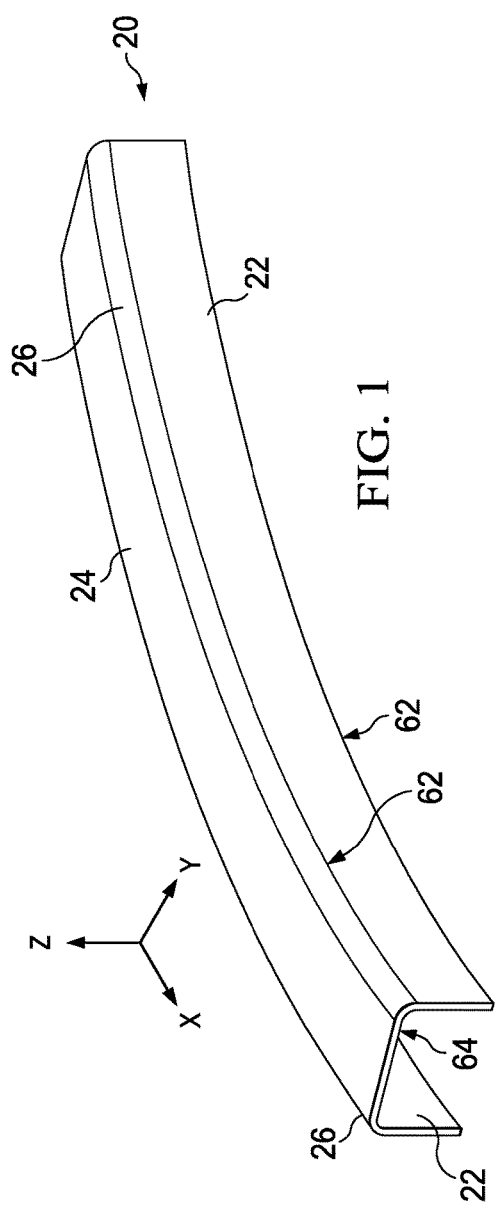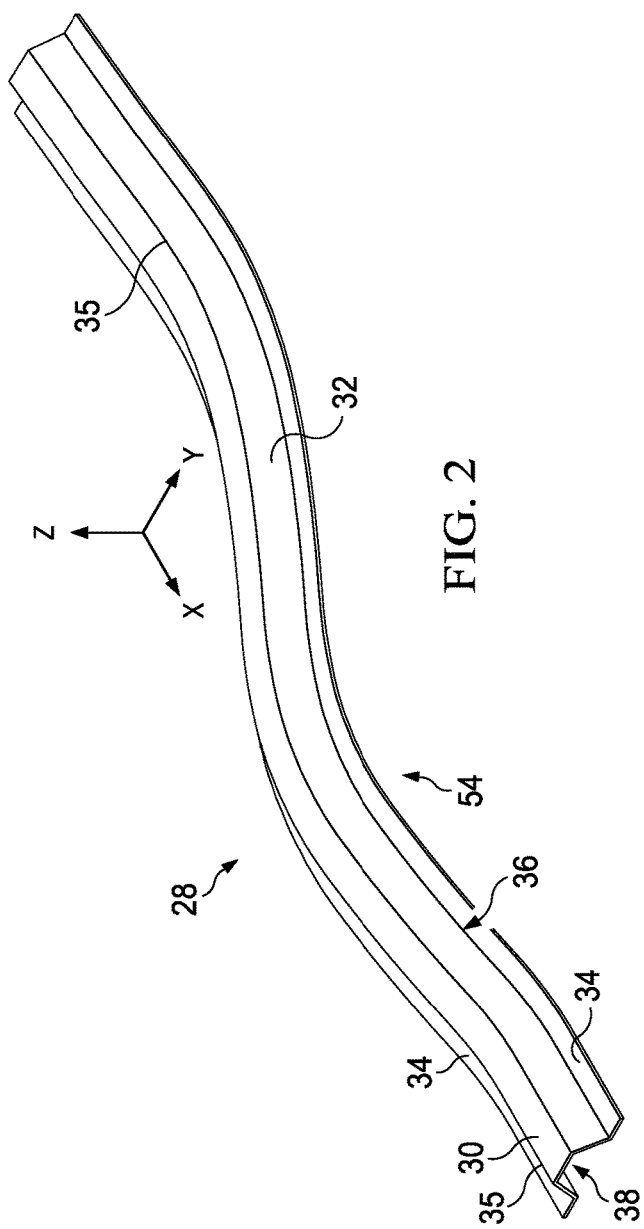

FORMING THERMOPLASTIC COMPOSITE PARTS HAVING STEERED FIBER ORIENTATIONS

BACKGROUND INFORMATION

1. Field

The present disclosure generally relates to fabrication of composite parts, and deals more particularly with a method of making thermoplastic composite parts using automated fiber placement and stamp forming.

2. Background

Stamp formed thermoplastic composite (TPC) parts are being used with increasing frequency because of their advantages over comparable parts made from thermoset resins. Generally, stamp forming of TPC parts allows for lower cost and faster processing. For example, thermoset parts must remain on shaping tools for relatively long cure times. Long cure times reduce the rate at which parts can be produced by each tool, since the tool is not available to produce additional parts while a part is being cured. In contrast, a single stamp forming tool can rapidly make TPC parts by stamp forming preconsolidated TPC blanks. Stamp forming is uniquely suited to TPCs because preconsolidated TPC blanks are simple to produce, and may be re-melted, allowing them to be quickly stamp formed to net-shape.

Stamp forming of TPC parts has certain limitations, however. For example, difficulty may be encountered when stamp forming parts with complex and/or sharp features or angles because of the orientation of reinforcing fibers in the TPC blank, particularly where unidirectional fibers are employed. Depending on the shape of the part, certain fiber orientations may cause the fibers to resist being formed to the desired shape, thereby causing undesired wrinkling or bunching of the material. In some applications, current restrictions on fiber placement and orientation may also place limitations on load transfer and performance of TPC parts.

Accordingly, there is a need for a method of stamp forming thermoplastic composite parts having steered fiber orientations that facilitate forming and/or load transfer.

SUMMARY

The disclosed embodiments provide stamp forming of small and/or complex TPC parts using optimized, tailored blanks automatically laid up using fiber steering to achieve desired fiber orientations, either in localized areas or throughout the part. The ability to achieve desired fiber orientations through fiber steering allows consolidated blanks to be stamp formed to net-shape without wrinkling or bunching. In one variation, automated fiber placement is used to layup a preform on a near net-shape tool. The near net-shape part is then re-melted and stamp formed to final net-shape. The embodiments permit production of parts having shapes and small features that may not be possible through automated layup directly on a net-shaped tool. The embodiments are well-suited to high rate production environments and may reduce product flow times.

According to one disclosed embodiment, a method is provided of producing a thermoplastic composite part, comprising laying up a multi-ply thermoplastic composite laminate using an automated fiber placement machine, including locally tailoring fiber orientation by steering the prepreg fibers into alignment with features of the laminate. The method also includes heating the thermoplastic laminate to a temperature at which the thermoplastic laminate may be formed, and stamp forming the thermoplastic laminate into a desired part shape.

According to another disclosed embodiment, a method is provided of producing a thermoplastic composite part, comprising assembling a substantially flat, multi-ply thermoplastic composite blank, including building at least one ply by steering prepreg fibers onto a substrate with fiber orientations aligned with local features of the composite part, and consolidating the thermoplastic composite blank. The method also includes heating the thermoplastic composite blank to a temperature at which the thermoplastic composite blank may be formed, and forming the thermoplastic composite blank into a desired part shape.

According to still another disclosed embodiment, a method is provided of producing thermoplastic composite parts, comprising laying up a plurality of thermoplastic composite blanks, including using automated fiber placement to steer prepreg fibers onto a substrate with locally aligned fiber orientations, and consolidating each of the thermoplastic composite blanks. The method further includes arranging the thermoplastic composite blanks into a group, serially feeding thermoplastic composite blanks from the group thereof to a stamp forming machine, and stamp forming each of the thermoplastic composite blanks fed from the group thereof.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and advantages thereof, will best be understood by reference to the following detailed description of an illustrative embodiment of the present disclosure when read in conjunction with the accompanying drawings, wherein:

FIG. 1 is an illustration of a perspective view of a curved TPC C-channel.

FIG. 2 is an illustration of a perspective view of a TPC hat-type stringer having compound curvatures.

DETAILED DESCRIPTION

Figure 3:
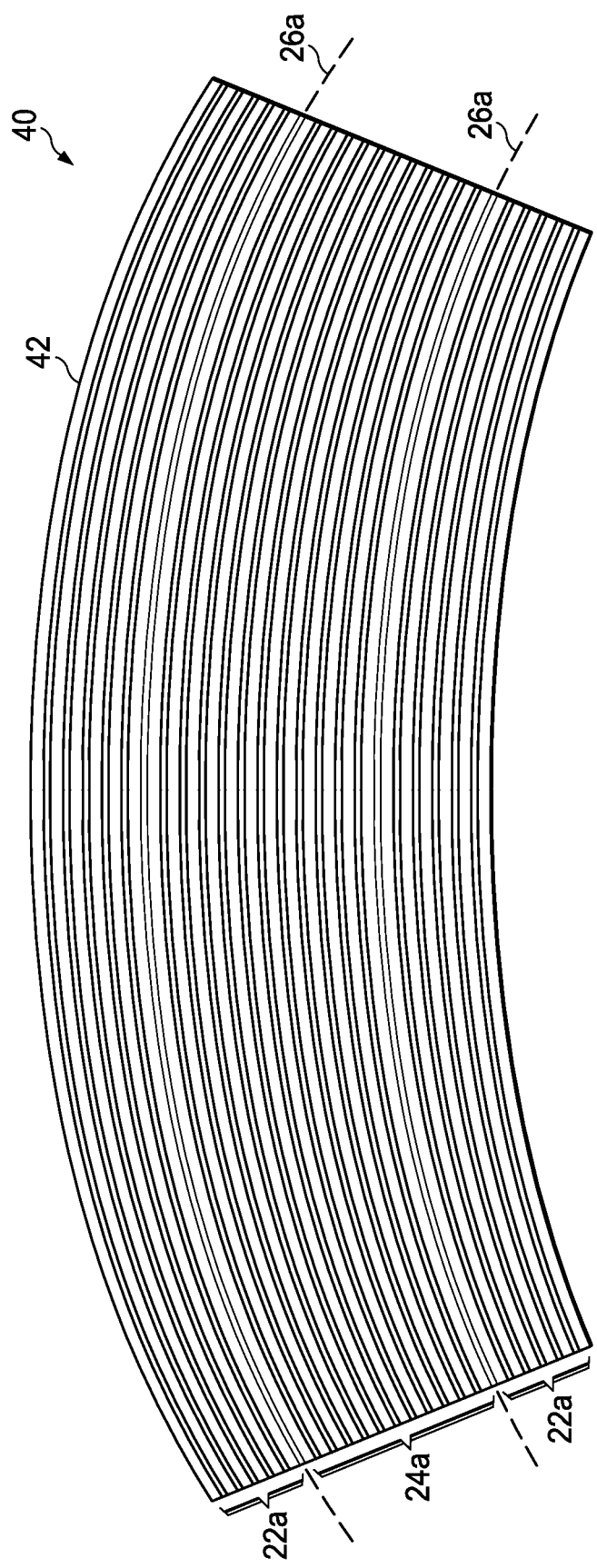
FIG. 3 is an illustration of a plan view of a flat TPC blank that may be stamp formed into the C-channel shown in FIG. 1.
Figure 4:
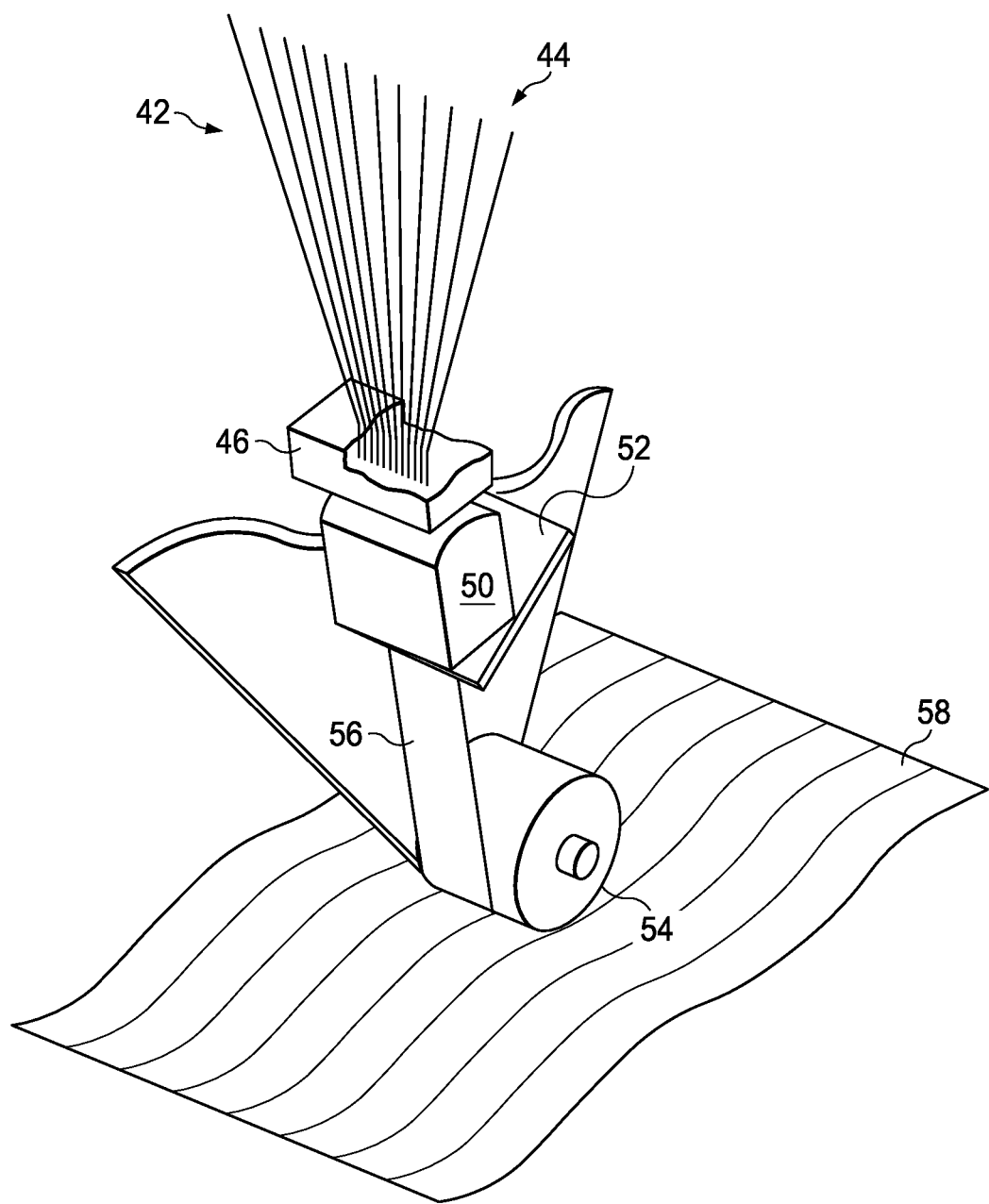
FIG. 4 is an illustration of a perspective view of an automated fiber placement head suitable for laying up the TPC blank shown in FIG. 3.

The disclosed embodiments may be employed to make thermoplastic composite (TPC) parts using a combination of automated composite material placement and stamp or press forming processes. In the exemplary embodiment described below, the composite material comprises prepreg tows that are steered onto a substrate using automated fiber placement (AFP) equipment, however, depending on the application, the composite material may comprise composite tape that is steered onto a substrate using automated tape laying (ATL) equipment. TPC parts may be produced that have small details or fine features which are difficult to achieve using automated composite material layup on a net-shape tool.

For example, referring to FIG. 1, the disclosed embodiments may be used to make a curved TPC part 20, sometimes referred to as a C-channel, that is curved in the XY plane and has a C-shaped cross-section with outer edges 62, 64. The C-channel 20 comprises a pair of substantially parallel flanges 22 that transition into a web 24 along a pair of radius edges 26. Similarly, AFP layup of a TPC blank followed by stamp forming may be employed to make a hat-type stringer 28 shown in FIG. 2. The stringer 28 includes a hat section 38 and a pair of laterally extending flanges 34. The hat section 38 includes a cap 30 connected to a pair of inclined webs 32 by outside radius edges 35. The inclined webs 32 are connected to the flanges 34 by inside radius edged 36. The hat stringer 28 has a double curvature both in the XY and XZ planes.

The C-shaped channel 20 shown in FIG. 1 may be produced by laying up a flat, multi-ply TPC blank 40 shown in FIG. 3 using an automated fiber placement head 44 mounted as an end effector on a robot (not shown) or similar manipulator. Each ply of the TPC blank 40 comprises multiple courses of prepreg fiber tows 42 that are steered onto a substrate, which may be a flat substrate or a contoured substrate, or an already laid, underlying ply. The TPC blank 40 comprises a web portion 24a, and flange portions at 22a which respectively correspond to the web 24 and flanges 22 of the C-shaped channel 20. The locations of the radius edges 26 are shown at 26a.

The AFP head 44 may include combs 46 that receive incoming prepreg tows 42 that pass through a ribonizer 50 before being combined into a bandwidth 56 that is severed by a tow cutter 52. The bandwidth 56 of the cut tows 42 pass beneath a compliant roller 54 that applies and compacts the tows 42 on a substrate 58 or an underlying ply layer (not shown). Other AFP head configurations are possible. The AFP head 44 is automatically rotated and displaced in order to steer the tows 42 onto the substrate 58 in any desired fiber orientation. The ply illustrated in FIG. 3 comprises multiple courses of unidirectional tows 42 having a 0° fiber orientation. However, the other plies (not shown) of the TPC blank 40 may have other orientations, including but not limited to 90°, +/−45°, and +/−60°.

Figure 5:
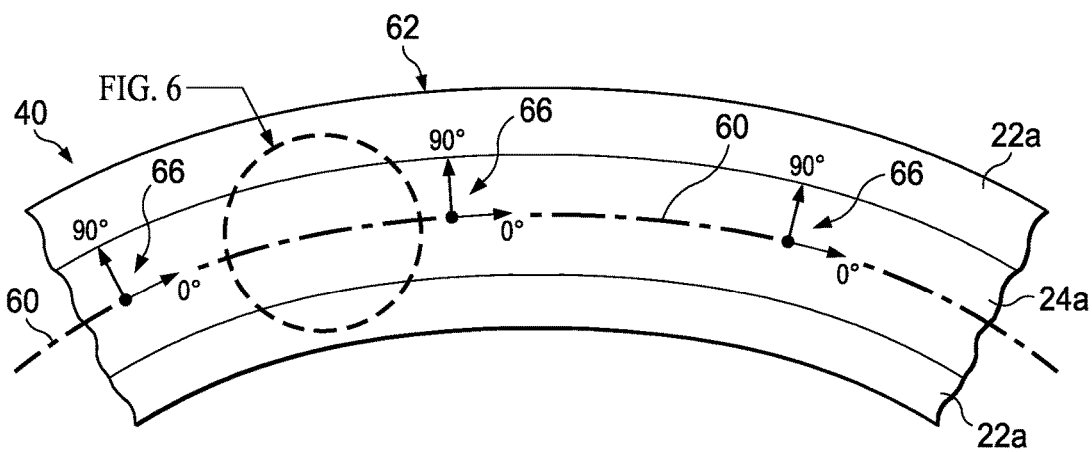
FIG. 5 is an illustration of a fragmentary plan view, similar to FIG. 3, showing localized fiber orientations aligned with an axis of symmetry of a TPC part.
Figure 6:
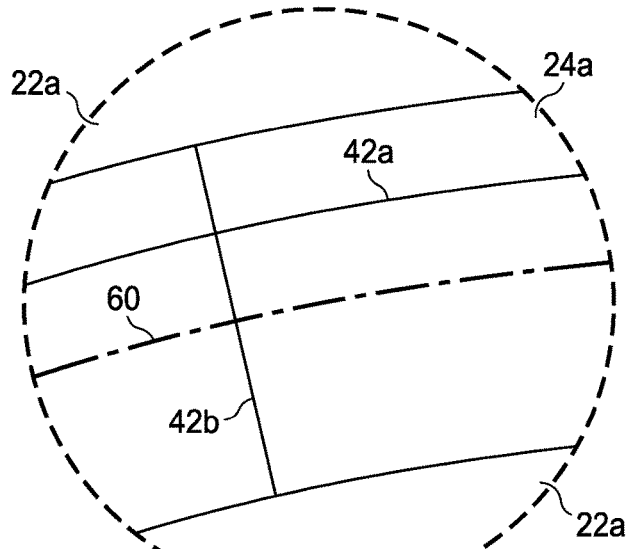
FIG. 6 is an illustration of the area designated as FIG. 6 in FIG. 5, also showing the local orientation of 2 orthogonal 0° and 90° fiber tows relative to the axis of symmetry.

Referring now to FIGS. 5 and 6, the fiber tows 42 are steered onto the substrate in directions wherein the fiber orientations are aligned with certain features of the TPC part 20, 28, such as the outer edges (see also FIG. 1) or local geometries in order to facilitate subsequent forming of the part and/or to improve load transfer characteristics either in local areas or throughout of the part. For example, and without limitation, the fiber tows 42 may be steered onto the substrate with fiber orientations that are aligned relative an axis of the TPC part, such as the axis of symmetry 60 of the TPC part 20. In the example shown in FIG. 5, one group of 0° tows 42a (FIG. 6) laid up at any particular location on the TPC part 20 lie tangent (parallel) to the axis of symmetry 60, while another group of 90° tows 42b at the same location lie normal (orthogonal) to the axis of symmetry 60. Thus, the orientation coordinate system for the tows 42, indicated by the 0°/90° rosette 66 shown in FIG. 5 may change over the area of the TPC blank 40. Similarly, the fiber tows 42 may be steered onto the substrate such that the fiber orientations are locally aligned with edges 62 of the TPC part 20, 28.

Figure 9:
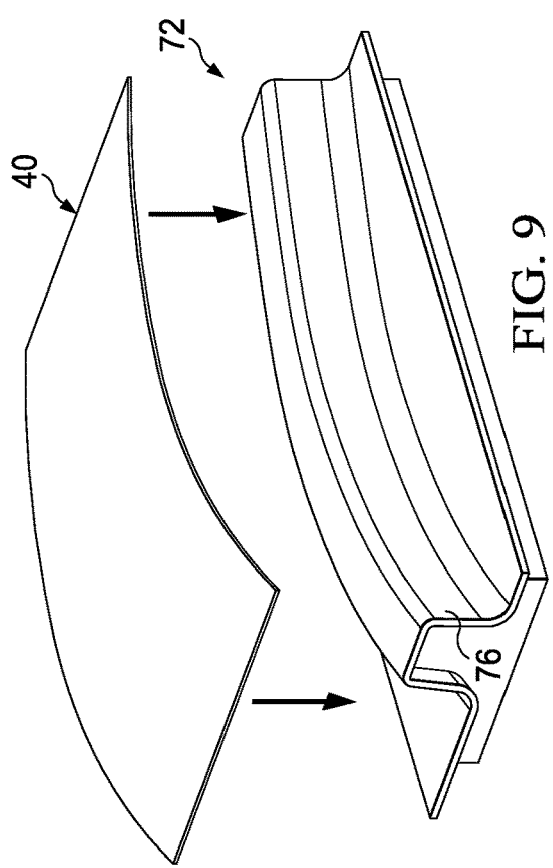
FIG. 9 is an illustration similar to FIG. 8 but showing the flat TPC blank being placed on the male portion of the tool set, in preparation for a stamp forming operation.
Figure 10:
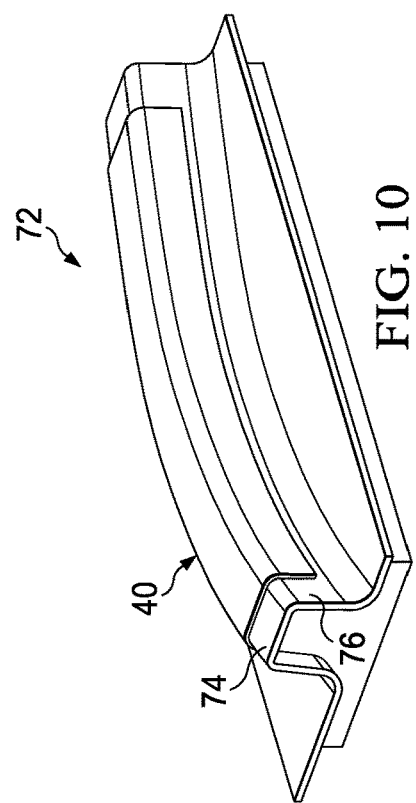
FIG. 10 is an illustration similar to FIG. 9, but showing the TPC blank having been stamp formed, the female portion of the tool set not shown for clarity.
Figure 7:
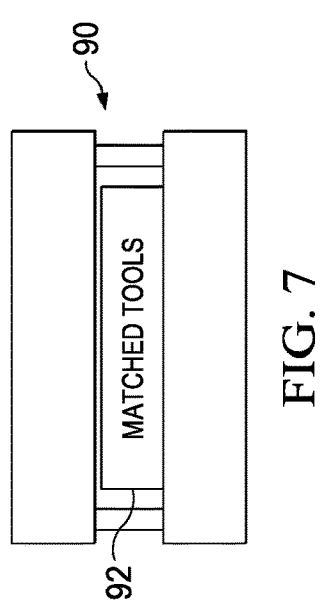
FIG. 7 is an illustration of a stamp forming press including a set of matched forming tools.
Figure 8:
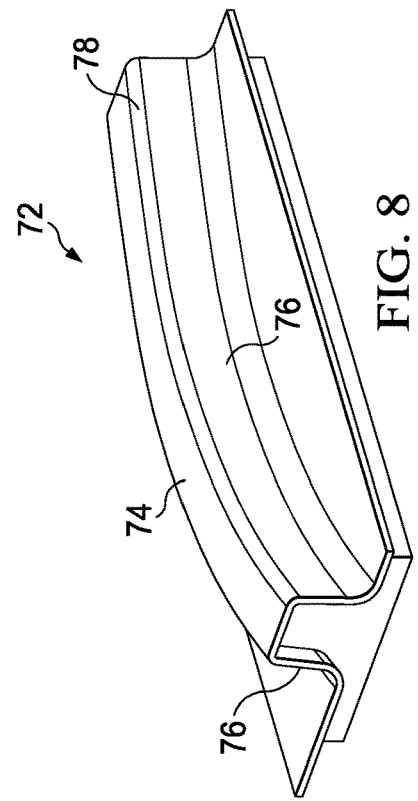
FIG. 8 is an illustration of a perspective view of a male portion of a tool set used to stamp form the blank shown in FIG. 3 into the C-channel shown in FIG. 1.

Referring now to FIGS. 7-10, a preconsolidated TPC blank 40 may be stamp formed into a net-shape part using a matched set of forming tools 92 and a stamp forming press 90. The matched set of tools 92 includes a male tool 72 and a matching female tool (not shown) having features matching the IML (inner mold line) of the part 20, including a web section 74 that transition through radius edge sections 78 into flange sections 76. The flat TPC blank 40 is heated to its forming temperature and placed onto the male tool 72 as shown in FIG. 9. The matched set of tools 92 is then closed, and compressed, causing the TPC composite blank 40 to be formed down onto the male tool 72. Because fiber orientations in the TPC blank are aligned relative to features of the tools, such as the contours of the of male tool 72, the fibers do not resist forming, allowing the blank 40 to be formed down over surfaces of the male tool portion 72 without wrinkling or bunching.

Figure 11:
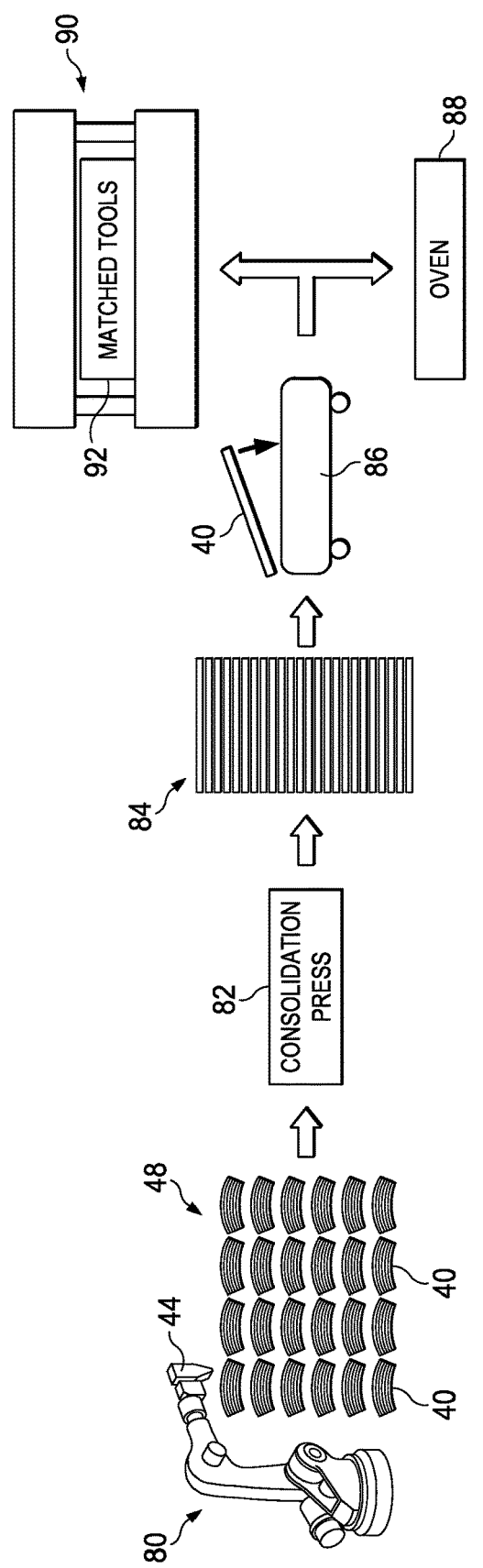
FIG. 11 is an illustration of a combined block and diagrammatic view showing a method of high rate production of stamp formed TPC parts.

Automated layup of TPC blanks 40 that are later stamp formed to final net part shape can be used to achieve high rate production. For example, referring to FIG. 11, an AFP head 44 controlled by a robot 80 a be used to layup a group 48 of TPC composite blanks 40, each having one or more plies with tailored fiber orientations as previously discussed. The group 48 of TPC blanks 40 may be consolidated together in a heated consolidation press 82 and subsequently arranged in a stack 84 representing an inventory that can be held until ready for final forming. Each of the TPC blanks 40 may be removed from the stack 84 and placed on a shuttle 86. The shuttle 86 then transports the blank 40 into an oven 88 where the blank 40 is heated to forming temperature.

Next, the shuttle 86 transports the heated blank 40 the stamp forming press 90 where it is formed into a net-shape part.

Figure 12:
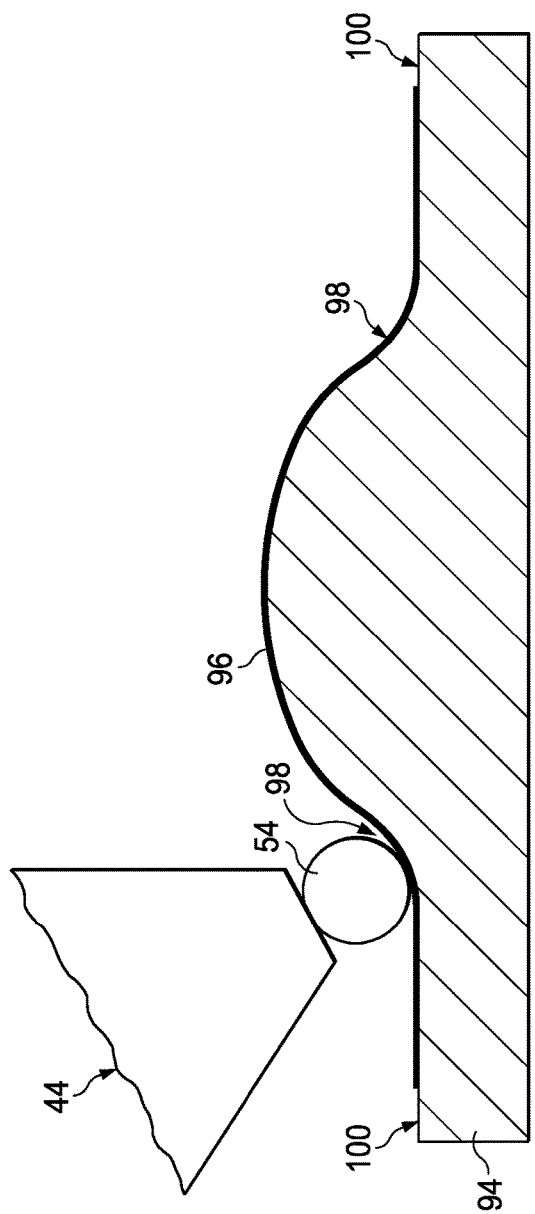
FIG. 12 is an illustration of a cross-sectional view of a near net-shaped layup tool on which an AFP head is laying up a near net-shape TPC preform suitable for being stamp formed into the hat-type stringer shown in FIG. 2.
Figure 13:
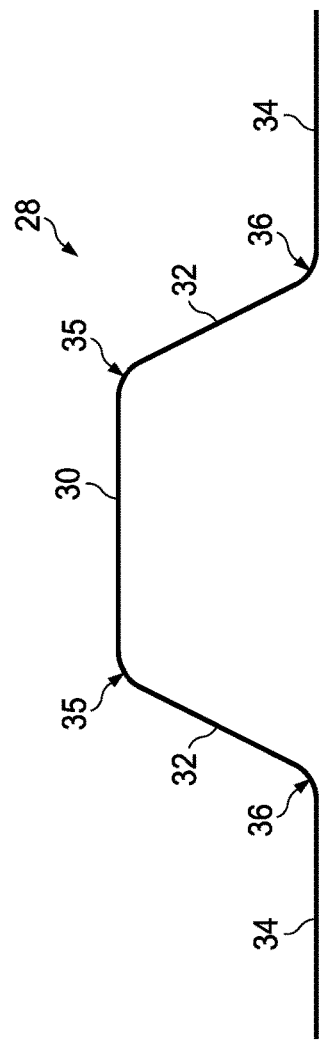
FIG. 13 is an illustration of a cross-sectional view showing the preform of FIG. 12 having been stamp formed to final net-shape.

In the previously described example, a flat composite blank 40 with tailored fiber orientations achieved through tow steering, is stamp formed into a net-shaped part. In some applications, it may be necessary or desirable to stamp form a TPC shaped preform that has been laid up with tailored fiber orientations to near net-shape. For example, referring to FIGS. 12 and 13, an AFP head 44 may be used to layup a TPC preform 96 on a net-shaped tool 94 having a tool surface 100 representing a near net-shape of the hat shaped stringer 28 shown in FIG. 13. The hat stringer 28 may be similar that shown in FIG. 2 which has relatively tight (short arc length) outside and inside radius edges, 35, 36 respectively. In this example, the diameter of the compaction roller 54 of the AFP head 44 (FIG. 12) may be too large to fully form the tight radius edges 35, 36, yet small enough to form radius edges 98 (FIG. 12) in the preform 96 that represent approximations (near net-shapes) of the radius edges 35, 36. After the TPC preform is laid up on the tool 94, the preform 96 may be consolidated before being reheated to melting temperature and then stamp formed into the net-shaped hat stringer 28 shown in FIG. 13.

In the examples described above, the TPC blank is consolidated in a separate consolidation process before being stamp formed to net-shape. In other examples however, it may be possible to consolidate the TPC blank using direct press consolidation. In direct press consolidation, the tailored TPC blank 40 is loaded into a press which is used to both consolidate the TPC blank and press form it to final net-shape in a combined process. Thus, the TPC blank 40 may be consolidated and formed to net-shape in a single operation using a single piece of equipment.

Figure 14:
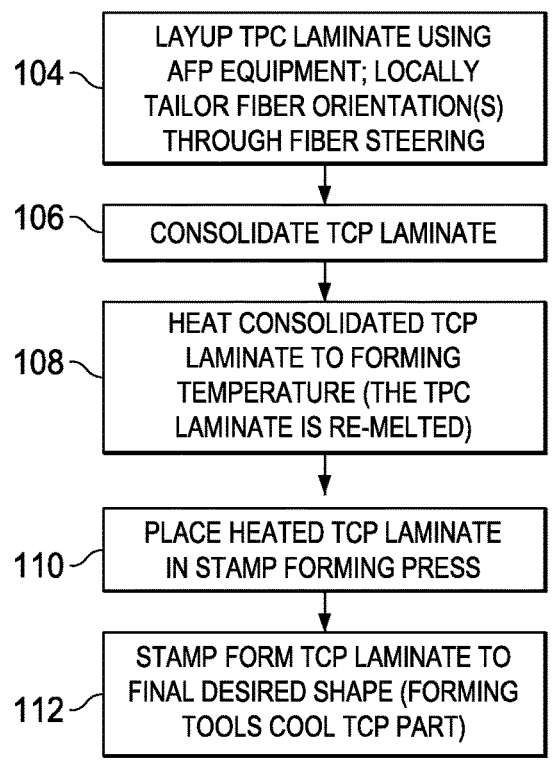
FIG. 14 is an illustration of a flow diagram of a method of producing a thermoplastic composite part having tailored fiber orientations.

FIG. 14 broadly illustrates the overall steps of a method of producing a TPC part. Beginning at 104, a TPC laminate is laid up using AFP equipment. Fiber orientations of tows are locally oriented through fiber steering. The layup process may include building a shaped preform by steering the fibers onto a shaped substrate. At 106, the TPC laminate layup is consolidated. At 108, the consolidated TPC laminate is heated to its forming temperature, causing the laminate resin to re-melt. Then at 110, the re-melted TPC laminate is placed in a stamp forming press between a pair of matched tools. Finally at 112, the TPC laminate is stamp formed into a final desired net-shape part. The tools used to form the laminate are not heated, and thus cool and cause the formed part to solidify.

Figure 15:
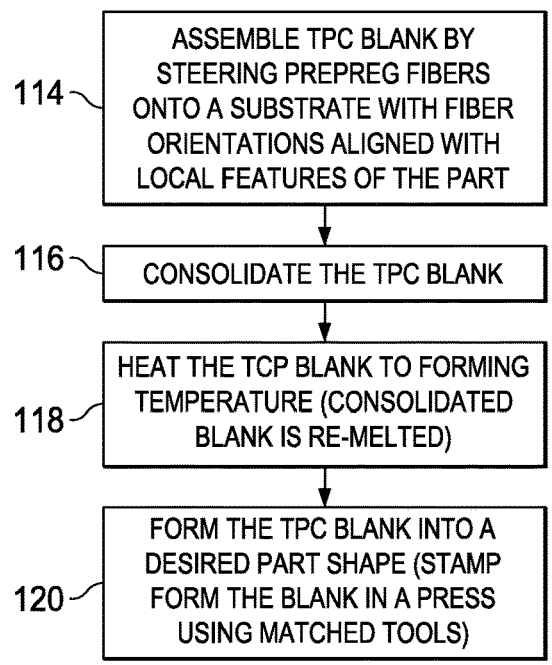
FIG. 15 is an illustration of a flow diagram of a method of producing a thermoplastic composite part by stamp forming a TPC blank having fiber orientations aligned with local features of the part.

FIG. 15 broadly illustrates the overall steps of an alternate embodiment of a method of producing a TPC part. At 114, a TPC blank 40 is assembled by steering prepreg fibers onto a substrate, wherein the fiber orientations are aligned with one or more local or overall features of the part. At 116, the TPC blank is consolidated. At 118 the TPC blank 40 is heated to forming temperature, causing the thermoplastic resin to re-melt. At 120, the TPC blank is formed into a desired net part shape by stamp forming the blank in a press using matched tools.

Figure 16:
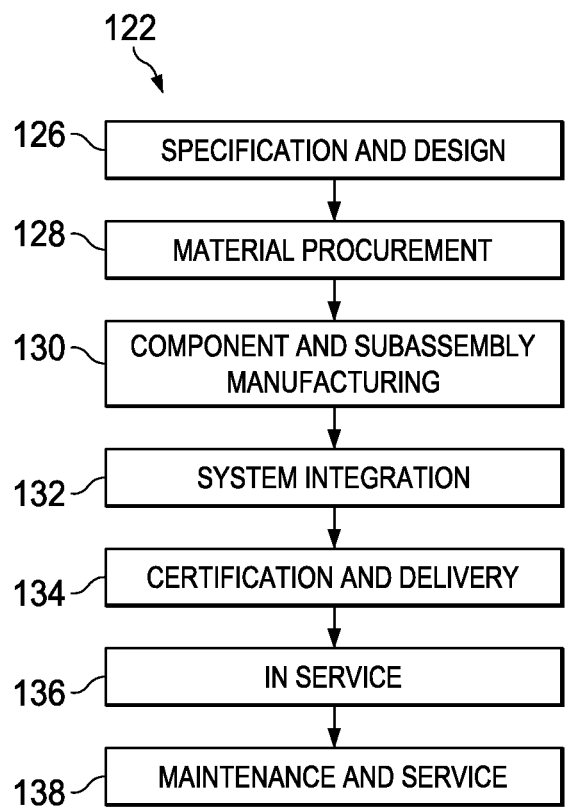
FIG. 16 is an illustration of a flow diagram of aircraft production and service methodology.
Figure 17:
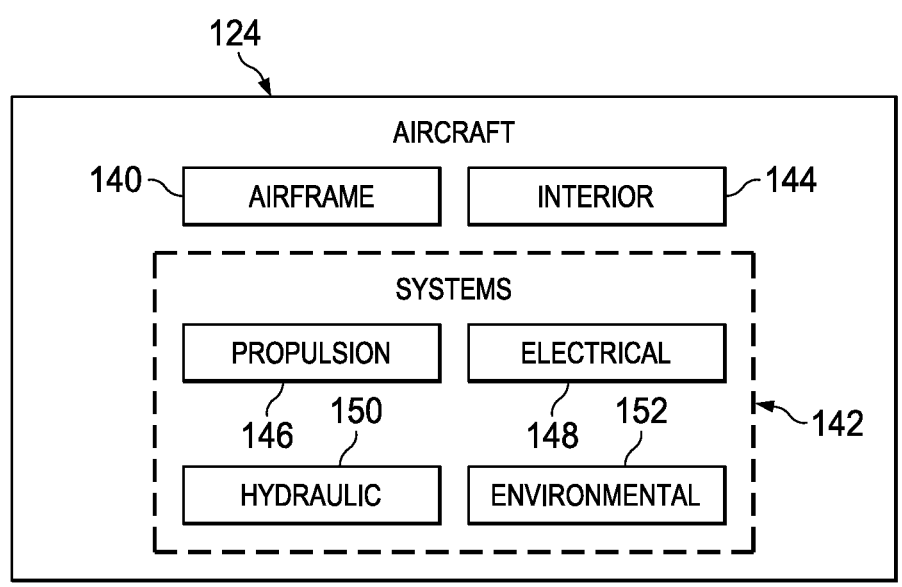
FIG. 17 is an illustration of a block diagram of an aircraft.

Embodiments of the disclosure may find use in a variety of potential applications, particularly in the transportation industry, including for example, aerospace, marine, automotive applications and other application where TPC parts are employed, particularly parts that are relatively small and/or have fine features. Thus, referring now to FIGS. 16 and 17, embodiments of the disclosure may be used in the context of an aircraft manufacturing and service method 122 as shown in FIG. 16 and an aircraft 124 as shown in FIG. 17. Aircraft applications of the disclosed embodiments may include, for example, without limitation, components of an airframe 140 such as stringers, as well as components of an interior 144. During pre-production, exemplary method 122 may include specification and design 126 of the aircraft 124 and material procurement 128. During production, component and subassembly manufacturing 130 and system integration 132 of the aircraft 124 takes place. Thereafter, the aircraft 124 may go through certification and delivery 134 in order to be placed in service 136. While in service by a customer, the aircraft 124 is scheduled for routine maintenance and service 138, which may also include modification, reconfiguration, refurbishment, and so on.

Each of the processes of method 122 may be performed or carried out by a system integrator, a third party, and/or an operator (e.g., a customer). For the purposes of this description, a system integrator may include without limitation any number of aircraft manufacturers and major-system subcontractors; a third party may include without limitation any number of vendors, subcontractors, and suppliers; and an operator may be an airline, leasing company, military entity, service organization, and so on.

As shown in FIG. 17, the aircraft 124 produced by exemplary method 122 may include an airframe 140 with a plurality of systems 142 and an interior 144. Examples of high-level systems 142 include one or more of a propulsion system 146, an electrical system 148, a hydraulic system 150 and an environmental system 152. Any number of other systems may be included. Although an aerospace example is shown, the principles of the disclosure may be applied to other industries, such as the marine and automotive industries.

Systems and methods embodied herein may be employed during any one or more of the stages of the production and service method 122. For example, components or subassemblies corresponding to production process 130 may be fabricated or manufactured in a manner similar to components or subassemblies produced while the aircraft 124 is in service. Also, one or more apparatus embodiments, method embodiments, or a combination thereof may be utilized during the production stages 130 and 132, for example, by substantially expediting assembly of or reducing the cost of an aircraft 124. Similarly, one or more of apparatus embodiments, method embodiments, or a combination thereof may be utilized while the aircraft 124 is in service, for example and without limitation, to maintenance and service 138.

As used herein, the phrase "at least one of", when used with a list of items, means different combinations of one or more of the listed items may be used and only one of each item in the list may be needed. For example, "at least one of item A, item B, and item C" may include, without limitation, item A, item A and item B, or item B. This example also may include item A, item B, and item C or item B and item C. The item may be a particular object, thing, or a category. In other words, at least one of means any combination items and number of items may be used from the list but not all of the items in the list are required.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different advantages as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method of producing a thermoplastic composite part, comprising:
   laying up a multi-ply thermoplastic composite laminate using an automated fiber placement machine, including locally tailoring fiber orientation by steering fibers, wherein laying up the multi-ply thermoplastic composite laminate includes making a preform by steering the fibers onto a near net-shaped tool or an already laid underlying ply associated with the near net-shaped tool;
   consolidating the multi-ply thermoplastic composite laminate;
   heating the multi-ply thermoplastic composite laminate to a temperature at which resin in the multi-ply thermoplastic composite laminate may be formed; and
   stamp forming the multi-ply thermoplastic composite laminate into a three-dimensional net-shaped part using forming tools to form the thermoplastic composite part, wherein the stamp forming includes forming the preform to the net-shaped part to form the thermoplastic composite part, wherein a net shape is different from a three-dimensional near net-shape of the preform wherein steering the fibers by the automated fiber placement machine comprises steering the fibers into alignment with features of the forming tools.

2. The method of claim 1, wherein steering the fibers includes steering fibers in directions substantially normal to edges of the thermoplastic composite part.

3. The method of claim 1, wherein steering the fibers includes steering the fibers in directions aligned with one or more local features of the thermoplastic composite part to facilitate subsequent forming of the thermoplastic composite part and/or to improve load transfer characteristics of the thermoplastic composite part.

4. The method of claim 1, wherein steering the fibers comprises steering the fibers to have a fiber orientation either normal or parallel relative to an axis of symmetry of the thermoplastic composite part.

5. The method of claim 1, wherein the automated fiber placement machine is capable of laying up the multi-ply thermoplastic composite laminate onto the near net-shaped tool but not capable of laying up a multi-ply thermoplastic composite laminate with the three-dimensional part shape of the net-shaped part.

6. The method of claim 1, wherein the three-dimensional part shape is formed only from the multi-ply thermoplastic composite laminate.

7. The method of claim 1, wherein the multi-ply thermoplastic composite laminate is formed down over surfaces of a male tool portion during stamp forming without wrinkling or bunching due to the locally tailoring fiber orientation.

8. A method of producing a thermoplastic composite part, comprising:
   assembling a multi-ply thermoplastic composite blank onto a near net-shaped substrate using an automated fiber placement machine or an automated tape laying machine;
   consolidating the multi-ply thermoplastic composite blank;
   heating the multi-ply thermoplastic composite blank to a temperature at which the multi-ply thermoplastic composite blank may be formed; and
   forming the multi-ply thermoplastic composite blank into the thermoplastic composite part having a net shape using stamp forming, wherein the net shape is a three-dimensional part shape different from a three-dimensional near net-shape of the multi-ply thermoplastic composite blank, wherein the automated fiber placement machine or automated tape laying machine is capable of laying up the multi-ply thermoplastic composite blank onto the near net-shaped substrate but not capable of laying up a multi-ply thermoplastic composite blank with the three-dimensional part shape of the thermoplastic composite part.

9. The method of claim 8, wherein:
   assembling the multi-ply thermoplastic composite blank comprises building at least one ply by steering prepreg fibers to have fiber orientations aligned with one or more features of the thermoplastic composite part.

10. The method of claim 9, wherein:
    the one or more features includes an axis of symmetry of the thermoplastic composite part, and
    steering prepreg fibers includes orienting at least a first group of the prepreg fibers substantially normal to the axis of symmetry, and orienting at least a second group of the prepreg fibers substantially parallel to the axis of symmetry.

11. The method of claim 9, wherein:
    the one or more features includes an edge of the thermoplastic composite part; and
    steering the prepreg fibers includes orienting the prepreg fibers substantially normal to the edge of the thermoplastic composite part.

12. The method of claim 9, wherein the thermoplastic composite blank is formed down over surfaces of a male tool portion during stamp forming without wrinkling or bunching due to the steering of the prepreg fibers to have the fiber orientations aligned with the one or more features of the thermoplastic composite part.

13. The method of claim 8, wherein consolidating and forming the multi-ply thermoplastic composite blank are performed in substantially a single operation in a direct press consolidation process.

14. The method of claim 8, wherein the three-dimensional part shape is formed only from the thermoplastic composite blank.

15. A method of producing thermoplastic composite parts, comprising:
    laying up a plurality of thermoplastic composite blanks using an automated fiber placement machine or automated tape laying machine to steer prepreg fibers of each of the plurality of thermoplastic composite blanks onto a respective substrate such that the prepreg fibers have locally aligned fiber orientations with one or more features of the thermoplastic composite parts;
    consolidating each of the thermoplastic composite blanks together in a same consolidation press;
    arranging the plurality of thermoplastic composite blanks into a group of thermoplastic composite blanks;
    serially feeding thermoplastic composite blanks from the group of thermoplastic composite blanks individually to a stamp forming machine; and
    stamp forming each of the thermoplastic composite blanks fed from the group of thermoplastic composite blanks into a three-dimensional part shape using the stamp forming machine to form the thermoplastic composite parts, wherein the automated fiber placement machine or automated tape laying machine is not capable of laying up a multi-ply thermoplastic composite laminate with the three-dimensional part shape of the thermoplastic composite parts, and wherein steering the prepreg fibers of each of the plurality of thermoplastic composite blanks comprises steering the prepreg fibers of each of the plurality of thermoplastic composite blanks into alignment with features of the stamp forming machine.

16. The method of claim 15, wherein consolidating each of the thermoplastic composite blanks includes consolidating the group of thermoplastic composite blanks in a press.

17. The method of claim 15, wherein:
  laying up the thermoplastic composite blanks includes steering the prepreg fibers of each of the plurality of thermoplastic composite blanks onto a respective near net-shaped tool, and
  the stamp forming includes forming the plurality of thermoplastic composite blanks, each having a three-dimensional near-net shape, to net-shaped parts to form the thermoplastic composite parts.

18. The method of claim 15, wherein the three-dimensional part shape is formed only from a respective thermoplastic composite blank.

* * * * *